US006870426B2

(12) United States Patent
Dashtestani et al.

(10) Patent No.: US 6,870,426 B2
(45) Date of Patent: Mar. 22, 2005

(54) OUTPUT STAGE, AMPLIFIER AND ASSOCIATED METHOD FOR LIMITING AN AMPLIFIER OUTPUT

(75) Inventors: Ahmad Dashtestani, Tucson, AZ (US);
Joel Martin Halbert, Tucson, AZ (US);
Alan Lee Varner, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 82 days.

(21) Appl. No.: 10/609,209

(22) Filed: Jun. 27, 2003

(65) Prior Publication Data

US 2004/0263252 A1 Dec. 30, 2004

(51) Int. Cl.[7] .............................. H03F 3/26; H03F 3/45
(52) U.S. Cl. ...................... 330/267; 330/255; 330/257
(58) Field of Search ................................ 330/267, 255, 330/257

(56) References Cited

U.S. PATENT DOCUMENTS

| 5,319,260 | A | * | 6/1994 | Wanlass ....................... 326/26 |
| 5,654,671 | A | | 8/1997 | Murray |
| 5,736,902 | A | | 4/1998 | Graeme |
| 5,907,262 | A | * | 5/1999 | Graeme et al. ............. 330/255 |
| 6,166,579 | A | * | 12/2000 | Hojabri et al. .............. 327/308 |
| 6,232,805 | B1 | * | 5/2001 | Brandt ........................ 327/108 |
| 6,504,419 | B1 | | 1/2003 | Damitio et al. |
| 6,507,231 | B1 | * | 1/2003 | Hecht et al. ................. 327/321 |
| 6,714,048 | B1 | * | 3/2004 | Sharpe-Geisler ............. 326/68 |

OTHER PUBLICATIONS

Analog Devices, "Low Distortion, Wide Bandwidth Voltage Feedback Clamp Amps AD8036/AD8037". www.analog.com, pp. 1–23, Analog Devices, Inc., 2000.

Burr–Brown Products from Texas Instruments," OPA688 SpeedPlus (trademark) Unity Gain Stable, Wideband Voltage Limiting Amplifier", Texas Instruments Incorporated, pp. 1–17, Copyright 1997.

National Semiconductor, "CLC501 High Speed, Output Clamping Op Amp", National Semiconductor Corporation, pp. 1–10, Feb. 2001.

* cited by examiner

*Primary Examiner*—Patricia Nguyen
(74) *Attorney, Agent, or Firm*—W. Daniel Swayze, Jr.; W. James Brady; Frederick J. Telecky, Jr.

(57) ABSTRACT

A system and method for implementing an amplifier capable of limiting or clamping an amplifier output signal is described. A clamp buffer and an input buffer cooperate to bias an output circuit according to the relative level of a clamp signal and an input signal. In a normal mode, in which the input signal has a first relationship with the clamp signal, the output circuit provides an output signal based on the input signal. In a clamping mode, in which the input signal has a second relationship with the clamp signal, the output circuit provides an output signal based on the clamp signal, which can be substantially fixed. The clamp signal can be set by the user to establish a desired clamping range.

30 Claims, 6 Drawing Sheets

OUTPUT STAGE, AMPLIFIER AND ASSOCIATED METHOD FOR LIMITING AN AMPLIFIER OUTPUT

TECHNICAL FIELD

The present invention relates to electrical circuits and, more particularly, to an output stage, amplifier and associated method for limiting an output signal.

BACKGROUND OF INVENTION

Various types of amplifier circuits have been developed for a myriad of applications, such as including audio applications, video applications and communications applications to name a few. Some core considerations for most amplifier designs are the ability to support a wide bandwidth and provide low distortion in the amplified output signal.

In certain circumstances, it is desirable to limit the upper and/or lower bounds of an amplifier output voltage. Consequently, a type of amplifier generally referred to as voltage limiting or clamping amplifier has been developed. Clamping amplifiers are useful to enable a user to protect downstream circuitry, such as from over driving input signals to the amplifier. Thus, clamping amplifiers can be utilized in various amplifier configurations for audio, video and communications applications. Examples of some clamping amplifier circuit configurations include non-inverting gain amplifiers, inverting gain amplifiers, rectifiers, Schmitt triggers, unity gain buffers and pulse generators.

Typical clamping amplifiers enable a user to set high and low clamping voltages for the amplifier output voltage. Thus, by setting the clamping voltages, the output of the amplifier will clamp at the specified levels.

By way of example, one type of clamping amplifier includes first and second amplifier stages. Input pins receive a differential input voltage as well as both high and low clamping voltages. Input buffers isolate the input pins from a pair of comparators and an associated switch. The comparators drive the switch through a decoder to control which buffered input is provided to the non-inverting input of the first gain stage of the amplifier. This type of clamping amplifier configuration generally only works for non-inverting or follower applications. To clamp in an inverting circuit configuration, an additional inverting gain stage would be required. Additionally, since the clamping is implemented at the input of the amplifier, the clamp voltage levels and input error are multiplied by the amplifier's closed loop gain at the output. Consequently, this further requires that calculations be performed in order to set desired clamping levels for the amplifier.

While various other approaches exist for implementing the voltage clamping, improvements in performance for clamping amplifiers are still desired for many applications.

SUMMARY OF INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention relates generally to a system and method to clamp an output voltage in an amplifier. In a normal mode, in which the input signal has a first relationship with the clamp signal, an output signal is provided based on the input signal. In a clamping mode, in which the input signal has a second relationship with the clamp signal, the output circuit provides an output signal based on the clamp signal, which can be substantially fixed. The clamp signal can be set by the user to establish a desired clamping range.

According to one aspect of the present invention, an output stage for an amplifier is provided. The output stage includes an input buffer that receives an input signal and a clamping buffer coupled to the input buffer that receives a clamp signal. One of the input buffer and the clamping buffer biases an associated output to provide an output signal depending on the input signal relative to the clamp signal. The input signal can be provided by a preceding amplifier stage.

By implementing the clamping buffer in the output stage in such a manner, clamping can be facilitated. Such an arrangement also facilitates implementing various amplifier configurations (e.g., inverting, non-inverting, etc.) with little or no overhead. Additional efficiencies in operation and design can be achieved, for example, by implementing the output stage as part of an amplifier system in an integrated circuit and/or by configuring the clamping buffer and the input buffer to share one or more components to facilitate biasing the output.

According to another aspect of the present invention, the input buffer and the clamping buffer can be coupled to drive an associated output circuit through an arrangement of one or more biasing networks. This further enables the clamping buffer to be implemented with substantially smaller components than the output circuit. As a result, the overall footprint size for the output stage can be reduced by implementing an amplifier integrated circuit according to such an arrangement.

The following description and the annexed drawings set forth certain illustrative aspects of the invention. These aspects are indicative, however, of but a few of the various ways in which the principles of the invention may be employed. Other advantages and novel features of the invention will become apparent from the following detailed description of the invention when considered in conjunction with the drawings.

DETAILED DESCRIPTION OF THE INVENTION

The present invention relates generally to a system and method for implementing an amplifier capable of limiting or clamping an amplifier output signal. A clamp buffer and an input buffer cooperate to bias an output circuit according to the relative level of a clamp signal and an input signal. In a normal mode, in which the input signal has a first relationship with the clamp signal, the output circuit provides an output signal based on the input signal. In a clamping mode, in which the input signal has a second relationship with the clamp signal, the output circuit provides an output signal based on the clamp signal, which can be substantially fixed. The clamp signal can be set by the user to establish a desired clamping range.

Figure 1:
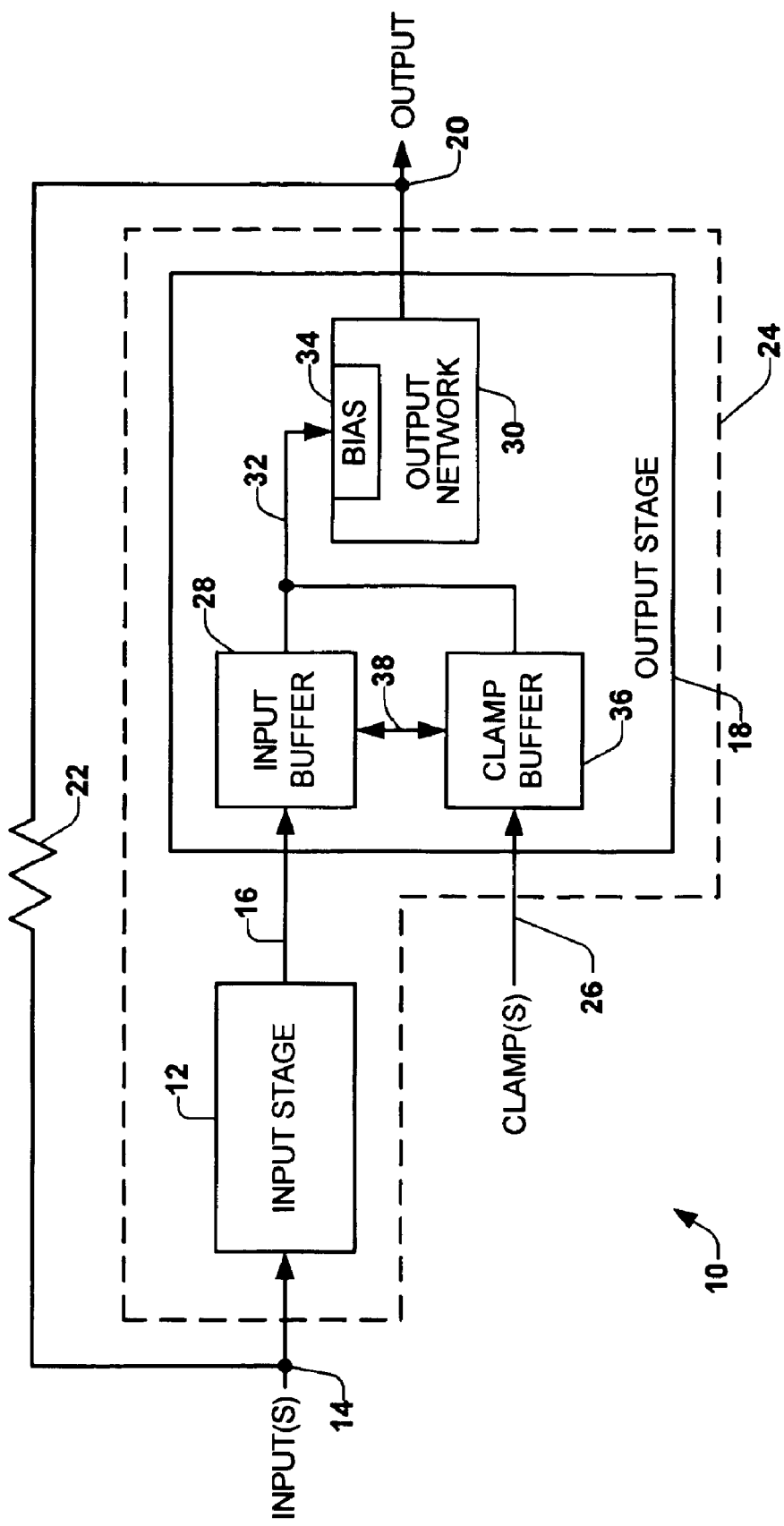
FIG. 1 depicts an example of an amplifier circuit implementing an output stage in accordance with an aspect of the present invention.

FIG. 1 depicts an example of an amplifier 10 that can be implemented in accordance with an aspect of the present invention. The amplifier 10 includes an input amplifier stage 12 that receives one or more input signals 14 and provides an intermediate signal at 16, which is utilized by an associated output amplifier stage 18. The input stage 12 typically provides the intermediate signal at an internal, high impedance node 16 of the amplifier 10. The input stage 12 can be configured to amplify the input signal 14 according to a desired gain value. Suitable gain for the amplifier 10 can be set, for example, by connecting an appropriate feedback resistance 22 between the output 20 and input 14. It is to be understood and appreciated that the amplifier 10 can be configured in an inverting or non-inverting configuration depending on how the feedback resistor 22 is connected to the input 14. In a typical configuration, the input 14 includes both inverting and non-inverting inputs.

The output stage 18 provides a corresponding output signal 20 for the amplifier 10 based on the signal provided by the input stage 12. The input stage 12 and the output stage 18 can be implemented as an integrated circuit (IC), represented schematically by dashed line 24. While the amplifier 10 is illustrated as a two-stage amplifier, including the input stage 12 and the output stage 18, it is to be understood and appreciated that the amplifier could be implemented with any number of one or more stages according to an aspect of the present invention.

The output stage 18, for example, is configured as a unity gain stage, although it can be implemented with other gain values. The output stage 18 includes one or more clamp inputs 26 that can be utilized to set one or more associated clamping levels for the amplifier 10. For example, the input 26 can include two inputs, each being operative to set a corresponding clamping level, such as a high clamping voltage and a low clamping voltage for the output 20. The clamping levels can be set independently of each other. The clamping level(s) defines a clamping range for the amplifier 10, thus, establishing parameters for normal and clamping operating modes.

The output stage 18 includes an input buffer 28 that receives the intermediate signal provided at 16. The input buffer 28 is coupled to an output network 30 that is operative to provide the output signal 20 based on a bias signal at a node 32, which can be provided by the input buffer 28. For example, the output network 30 includes bias circuitry (e.g., one or more current mirrors) 34 coupled to drive associated circuitry in the output network. Alternatively, the node 32 could be utilized as the output 20 (e.g., requiring no additional output network 30 or bias circuitry 34), although this configuration would typically require implementing the clamp buffer with larger circuit components (e.g., transistors) than utilized when utilized in combination with separate output circuitry 30, 34.

In the normal operating mode, the input buffer 28 drives the bias circuitry 34 via the buffered signal provided at 32. The output network 30 provides the corresponding output signal 20. The output stage 18 can be configured to amplify the signal 16 according to a gain, which in a typical amplifier output stage is set equal to one. In this way, the output signal at 20 follows the intermediate signal 16 during normal operation.

The output stage 18 also includes a clamp buffer 36 in accordance with an aspect of the present invention. The clamp buffer 36 receives one or more clamp input signals provided at input 26. As mentioned above, the clamp input 26 can correspond to one or more external pin connections of the IC 24, which can be employed to set the clamping level of the amplifier 10 based on the signal(s) provided at 26, which association is schematically indicated at 38. The clamp buffer 36 is operatively associated with the input buffer 28. The clamp buffer 36 cooperates with the input buffer 28 to control the operating condition of the output stage 18. When a clamping condition exists, the clamp buffer 36 provides a bias signal at 32 for driving the output signal at 20 based on the clamp signal at 26. The input buffer 28 further can be operate as an open circuit during the clamping condition, thereby disconnecting the input signal 16 from the output 20. That is, during the clamping condition, the clamp buffer 36 replaces the input buffer 28 for driving the output 20.

In one particular implementation, the clamp buffer 36 and the input buffer 28 can be coupled to the common node 32 to bias the bias circuitry 34 associated with the output network 30. This configuration enables both the input buffer and the clamp buffer to be implemented using substantially smaller transistors than those of the output network 30 (e.g., about 5 to 10 times smaller area). The smaller transistors further provide for an improved clamping response as well as a reduced footprint for the IC 24. The clamp buffer 36 and the input buffer 28 thus cooperate to drive the output network in a mutually exclusive manner based upon the clamp input signal at 26 relative to the intermediate signal at 16.

By way of example, assuming that the output stage 18 is operating in a normal mode in which the output signal at 20 follows the intermediate signal at 16 and that the clamp signal at 26 is set to a desired clamp voltage, which is greater than the intermediate signal at 16. As the intermediate signal at 16 increases (although still less than the clamping signal at 26), the output signal at 20 continues to follow the signal at 16. When the signal at 16 reaches the clamp voltage, the clamp buffer 36 takes over driving the output network 30 for driving the output 20 for so long as the voltage at 16 remains greater than the clamp voltage. Once the signal at 16 falls below the clamp voltage, the input buffer 28 resumes control of the output network 30 for driving the output at 20. It is to be appreciated that a similar clamp operating mode can exist where a low clamp level is also set by the clamp signal at 26.

Figure 2:
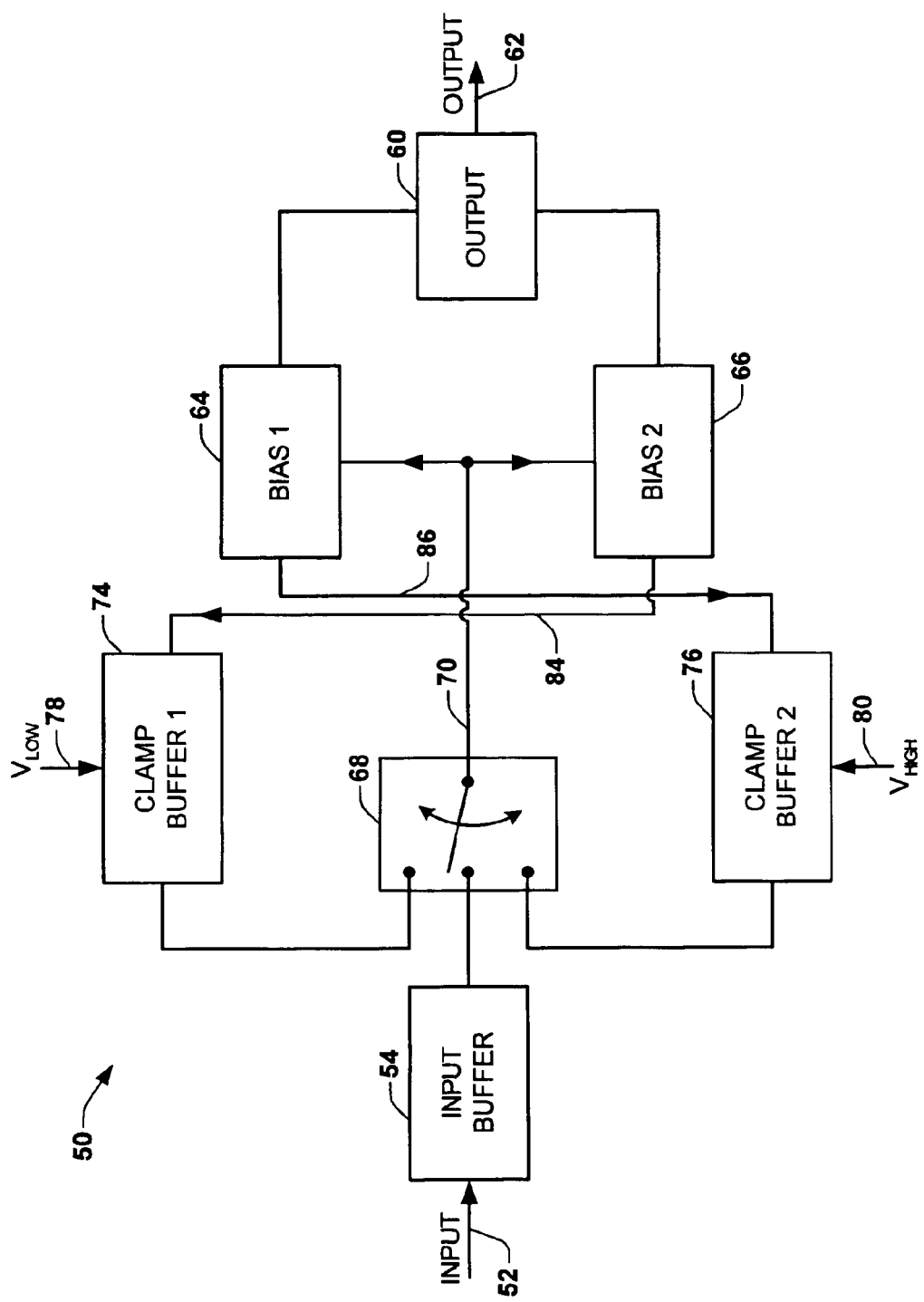
FIG. 2 depicts an example of an amplifier implemented in accordance with an aspect of the present invention.

FIG. 2 illustrates an example of an amplifier system 50 that can be implemented in accordance with an aspect of the present invention. The amplifier system 50 can be implemented as an independent current feedback amplifier or, alternatively, as an output stage of a current feedback amplifier, which can itself be implemented as a current feedback amplifier. An input signal is received at an input 52 that is provided to an input buffer network 54. For example, the input 52 can be an external input, such as where the amplifier system 50 is implemented as an independent amplifier or, alternatively, the input 52 can be an internal node of an IC (e.g., a compensation or high impedance node), such as where the amplifier system is an output stage of a multi-stage amplifier.

The input buffer network 54 is operative to drive associated output circuitry 60 to provide an output signal at an output 62 based on the signal provided at 52. The input buffer network 54, for example, can include complementary buffer stages in a diamond follower configuration to drive the output 62 in a push/pull manner according to the input signal at 52.

The input buffer network 54 is coupled to provide a buffered bias signal to associated bias networks 64 and 66. In the example of FIG. 2, the input buffer network 54 is coupled to the bias networks 64 and 66 through associated mode control block 68. The mode control block performs a switching function to control what input will drive the output at 62 through the bias networks 64 and 66. The bias networks 64 and 66 thus are coupled to drive the output circuitry 60 in a push/pull manner based on the input signal provided at 52. In a normal operating mode of the amplifier system 50, the mode control block 68 connects the respective input buffer network 54 to the associated bias networks 64 and 66. In this operating mode, the output signal at 62 can follow the input signal at 52.

In this example, the amplifier system 50 also includes a pair of clamp buffers 74 and 76. Each respective clamp buffer 74, 76 is coupled to an input of the mode control block 68. It is to be understood and appreciated that a first portion of the mode control block 68 can be formed by associated components (e.g., transistors) of the clamp buffer 74 and input buffer 54 and another portion formed by associated components of the clamp buffer 76 and input buffer 54. Thus, when operating in a clamping mode, the mode control block 68 couples a selected one of the respective clamp buffers 74 or 76 to drive the output circuitry through its associated bias networks 64 66. This also decouples the closed loop that is formed between the input 52 and the output 62 during normal operation.

In the example of FIG. 2, the clamp buffer 74 receives a clamping input signal indicated at $V_{LOW}$ at a clamping input 78. The signal $V_{LOW}$ provided at 78 can be set to a desired voltage level to set a low clamping level for the amplifier system 50. Similarly, the clamp buffer 76 receives a clamping input signal indicated at $V_{HIGH}$ at an input 80, which can be set to substantially a desired voltage level to establish a high clamping level for the amplifier system 50. Typically, $V_{LOW}$ and $V_{HIGH}$ are set to substantially fixed clamping voltages.

By way of example, the mode control block 68 connects one of the clamp buffer 74, the clamp buffer 76 or the input buffer 54 to control the respective bias networks 64 and 66. The selected mode is determined based on the levels of the clamp input signals $V_{LOW}$ and $V_{HIGH}$ relative to the input signal provided at 52. Depending on which buffers 54, 74 or 76 is selected, the bias networks 64 and 66 bias the output circuitry 60 to provide a corresponding output signal at 62.

For example, if the input signal at 52 is greater than the low clamp signal $V_{LOW}$ but less than $V_{HIGH}$, the mode control block 68 couples the input buffer 54 to control the associated bias networks 64 and 66. This corresponds to normal operation of the amplifier system 50 in which the output at 62 follows the input signal at 52.

Once the input signal 52 decreases and reaches $V_{LOW}$, the mode control block 68 operates to couple the clamp buffer 74 to drive the output circuitry 60 through the associated bias networks 64 and 66. Thus, the low clamp signal $V_{LOW}$ is utilized to drive the output signal at 62 at a desired level while the input signal at 52 is less than $V_{LOW}$. This mode of operation corresponds to a clamping mode for a low voltage input signal.

Assuming again that the amplifier system is operating in the normal mode in which the input signal 52 is less than $V_{HIGH}$ and greater than $V_{LOW}$, the mode control block 68 couples the input buffer 54 to bias the bias network 66. Once the input signal at 52 reaches $V_{HIGH}$, the mode control block 68 operates to decouple the input buffer 54 from the bias networks 64 and 66 and to connect the clamp buffer 76 to control the output circuitry through the bias networks. As a result, the output signal at 62 is maintained at the desired high clamping voltage (e.g., $V_{HIGH}$) while the input signal at 52 exceeds $V_{HIGH}$. This mode of operation corresponds to a high voltage clamping mode.

According to an aspect of the present invention, one or both of the clamp buffers 74 and 76 are operative to mitigate load dependent offset in the output signal during respective clamping modes. The offset, for example, can vary as a function of the load resistance (not shown) that is coupled to the output 62. To this end, the clamp buffer 74 can be coupled to the bias network 66, which connection is indicated at 84, and the clamp buffer 76 can be coupled with the bias network 64, which connection is indicated at 86. The connections 84 and 86 can be utilized by the respective clamp buffers 74 and 76 during their respective clamping modes to control the bias signal provided to the bias networks 64 and 66. In particular, the clamp buffers 74 and 76 can adjust their respective bias signals to drive the output circuitry 60 as a function of the load that is being driven.

For example, the bias signals from the clamp buffers 74 and 76 can be adjusted so that more current is provided for a lower resistance load and less current can be provided upon detecting a higher resistance load. As a result, a substantially fixed and stable clamping voltage can be provided at the output 62 during the clamping modes. By way of further example, the clamp buffer 74 can detect via connection 84 the load at the output 62 through the bias network 66 and adjust its bias (up or down) during the low voltage clamping mode accordingly as function of the load to maintain the desired clamping level (e.g., $V_{LOW}$). In a similar manner, during the high voltage clamping mode, the clamp buffer 76 can sense via connection 86 the load through the other bias network 64 and implement suitable biasing adjustments to help maintain the output at 62 at the desired high clamping level (e.g., $V_{HIGH}$).

It is to be understood and appreciated that the approach shown and described with respect to FIG. 2 further enables low distortion at the output 62 as the input signal at 52 approaches or is outside the respective clamp voltages. This provides a sharper clamping point than conventional approaches, such as those employing an arrangement of diodes to implement respective clamping voltages. Additionally, by implementing the mode control block 68 using a differential pair of transistors in associated buffers 54 and 74 as well as a differential pair of transistors in buffers 54 and 76, distortion can be further mitigated due to the improved linearity provided by the differential pair when compared to conventional approaches.

Additionally, since the amplifier 50 can operate as a current feedback amplifier, feedback (not shown) can be employed to couple the output 62 to the input buffer 54 and provide a closed loop amplifier system. Where the amplifier system 50 is implemented as an output stage, it is to be understood and appreciated that such feedback typically has a resistance selected to provide desired stability and implement unity gain.

Figure 3:
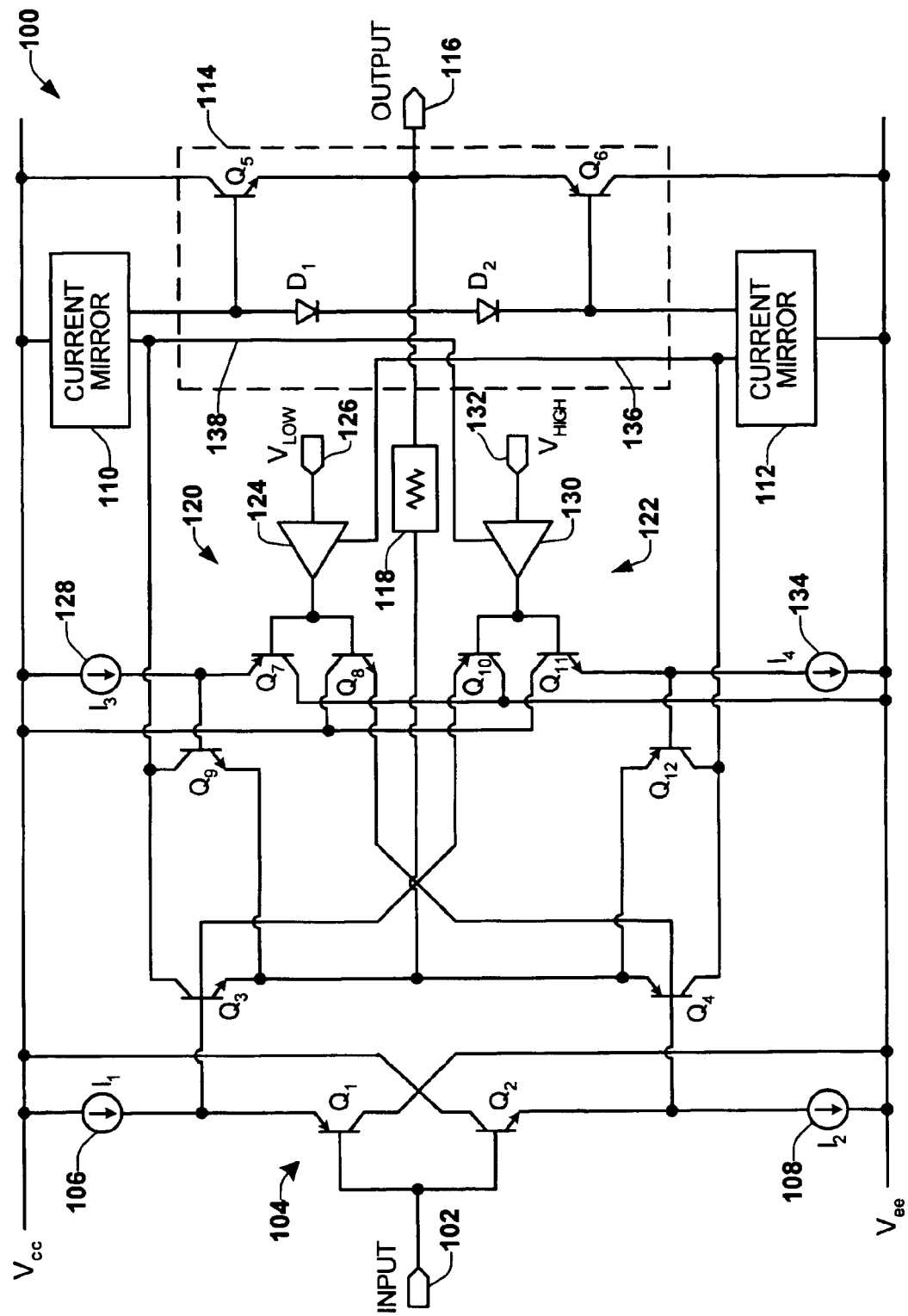
FIG. 3 depicts an example circuit diagram for an amplifier implemented in accordance with an aspect of the present invention.

FIG. 3 is a schematic diagram of an example amplifier circuit 100 that can be implemented in accordance with an aspect of the present invention. The amplifier circuit 100 includes an input 102 that receives an input signal. The input signal can be provided from a preceding amplifier stage, such as an input stage or intermediate stage of an associated amplifier, wherein the input 102 corresponds to an internal high impedance node of an IC implementing the circuit 100. Alternatively, the input signal received at 102 can correspond to a desired signal that is to be amplified/buffered by the circuit 100. The input is coupled to complementary transistors Q1 and Q2 of an input diamond follower network 104. The emitter of Q1 is coupled to receive a reference current I1 from an associated current source 106, which is coupled between Q1 and $V_{cc}$. Similarly, the emitter of Q2 is coupled to a current source 108, which is coupled between Q2 and $V_{cc}$, to sink current I2 relative to the emitter of Q2. The collector of Q1 is coupled to $V_{cc}$ and the collector of Q2 is coupled to $V_{cc}$.

The diamond follower 104 also includes transistors Q3 and Q4. The base of Q3 is coupled to the emitter of Q1 and the base of Q4 is coupled to the emitter of Q2. The collector of Q3 is coupled to bias an associated current mirror 110 based on the input signal provided at 102. The collector of Q4 similarly is coupled to bias another current mirror 112, also based on the input signal provided at 102. The current mirrors 110 and 112 are coupled to bias the output circuitry 114 to provide a corresponding output signal at an output 116 of the amplifier circuit 100.

In the example of FIG. 3, the output circuitry 114 includes a pair of output transistors Q5 and Q6 coupled in series between $V_{cc}$ and $V_{cc}$, with the output 116 connected at a common emitter of such transistors. Biasing diodes D1 and D2 are coupled in series between the bases of the respective transistors Q5 and Q6 as well as between the current mirrors 110 and 112. The current mirrors 110 and 112 thus provide bias control signals to the bases of Q5 and Q6, thereby operating the transistors in a push/pull arrangement according to the input signal provided at 102. A feedback resistor network 118 is coupled between the output 116 to a common emitter of Q3 and Q4 to provide a desired stability for the amplifier circuit 100. Where the amplifier circuit 100 is implemented as an amplifier output stage, for example, the feedback network 118 is an internal resistor configured to provide desired gain (e.g., unity gain). Additionally or alternatively, the feedback network 118 can be an external resistor coupled to provide desired gain for the amplifier circuit 100.

The amplifier circuit 100 also includes one or more auxiliary clamp buffer system 120 and 122 that cooperate with the input diamond follower 104 to implement clamping at the output 116 according to an aspect of the present invention. The first auxiliary buffer system 120 includes a clamp buffer network 124 that is coupled to receive a first clamping voltage signal, indicated at $V_{LOW}$ at an associated input terminal 126. The terminal 126 can be an external pin of the amplifier circuit 100 coupled to receive the clamping signal $V_{LOW}$. In this example, the first clamping signal $V_{LOW}$ corresponds to a low clamping limit for the amplifier circuit 100. The clamp buffer network 124 feeds a complementary pair of transistors Q7 and Q8 according to the low clamping signal $V_{LOW}$. The emitter of Q7 is coupled to a current source 128 to receive current I3. The current source 128 thus is coupled between $V_{cc}$ and Q7. The emitter of Q7 also is coupled to drive a base of an associated transistor Q9. Q9 has a common collector and common emitter with Q3, thus defining a differential pair operative to bias a current mirror 110 through their common collector. The collector of Q7 is coupled to $V_{cc}$. Q8 has its emitter coupled to the base of Q4 and its collector is coupled to $V_{cc}$. Q7, Q8, Q9 and Q4 thus define a diamond follower input buffer for the clamping signal $V_{LOW}$. Those skilled in the art further will appreciate that the input diamond follower buffer 104 and the diamond follower of the buffer system 120 share a common component, namely transistor Q4.

The second auxiliary clamp buffer system 122 is similarly configured and is also coupled to cooperate with the input diamond follower stage 104. The buffer system 122 includes an input buffer 130 that is coupled to receive a second clamping input signal at an input 132. In this example, the input provided at 132 corresponds to a high clamping signal, indicated at $V_{HIGH}$. The input buffer 130 is operative to drive a pair of complementary transistors Q10 and Q11. The emitter of Q10 is coupled to the base of Q3 and the collector of Q10 is coupled to $V_{cc}$. The emitter of Q11 is coupled to a current source 134 that sinks a current I4 relative to the emitter of Q11. The current source 134 is coupled between the emitter of Q11 and $V_{cc}$. The collector of Q11 is coupled to $V_{cc}$. Another transistor Q12 has a base coupled to the emitter of Q11 and includes a common emitter and common collector with Q4. That is, Q4 and Q12 form a differential pair, which is operative to control biasing of the current mirror 112 based on the input signal relative to the high clamping signal $V_{HIGH}$. Additionally, Q10, Q11, Q12 and Q3 define another diamond follower input buffer system 122, which shares Q3 with the input diamond follower buffer 104.

In view of the circuit configuration of FIG. 3, it will be appreciated that each of the pairs of transistors Q3 and Q9 as well as Q4 and Q12 operate as respective differential pairs that control biasing of the respective current mirrors 110 and 112 based on the input signal provided at 102 relative to the clamping voltages provided at 126 and 132. By way of example, in the low voltage clamping mode where the input reaches or is less than $V_{LOW}$, Q9 will be activated to bias the current mirror 110 based on the input signal provided by the buffer 124 to the bases of Q7 and Q8. In this mode of operation, Q3 will be off, as will Q1 and Q2 of the input diamond follower buffer 104. Q4, however, will operate as part of the auxiliary buffer system 120 for biasing the current mirror 112 to provide the desired substantially fixed output at 116 (e.g., $V_{LOW}$). Once the input signal provided at 102 exceeds $V_{LOW}$, normal operation resumes in which Q3 is activated to control biasing the current mirror 110 and Q9 is deactivated to an off condition. At this time, the input diamond follower stage 104, which consists of Q1, Q2, Q3 and Q4, will control operation of the respective current mirrors 110 and 112 to provide an output signal at 116 based on input signal at 102. When the input signal at 102 reaches the high clamping input signal $V_{HIGH}$ provided at 132, Q12 controls biasing the current mirror 112 and Q4, Q1 and Q2 are deactivated to their off condition. In the high voltage clamping mode, Q10 also biases Q3 to control biasing the current mirror 110 to help maintain a desired clamped output signal at 116 (e.g., $V_{HIGH}$).

Because the load (not shown) coupled to the output 116 can vary, the input buffers 124 and 130 of the respective buffer stages can be configured to adjust their output signals based on the load. For example, the respective buffers 124 and 130 can implement a current sensing function to implement a suitable load dependent clamp offset so that an adequate amount of current is provided by the output circuitry 114 at the output 116 to maintain a desired clamp voltage for driving the associated load. In order to implement the current sensing function, the input buffer 124 is coupled to the current mirror 112 (via connection 136) and the input buffer 130 is coupled to the current mirror 110 (via connection 138). In the particular implementation shown in FIG. 3, the connection 136 is coupled to the common collector of Q4 and Q12 and connection 138 is coupled to the common collector of Q3 and Q9. Those skilled in the art will understand and appreciate various approaches that can be utilized to adjust the output current as a function of the load connected at the output 116 so as to maintain a desired fixed output at the 116 during the respective clamping modes.

Figure 4:
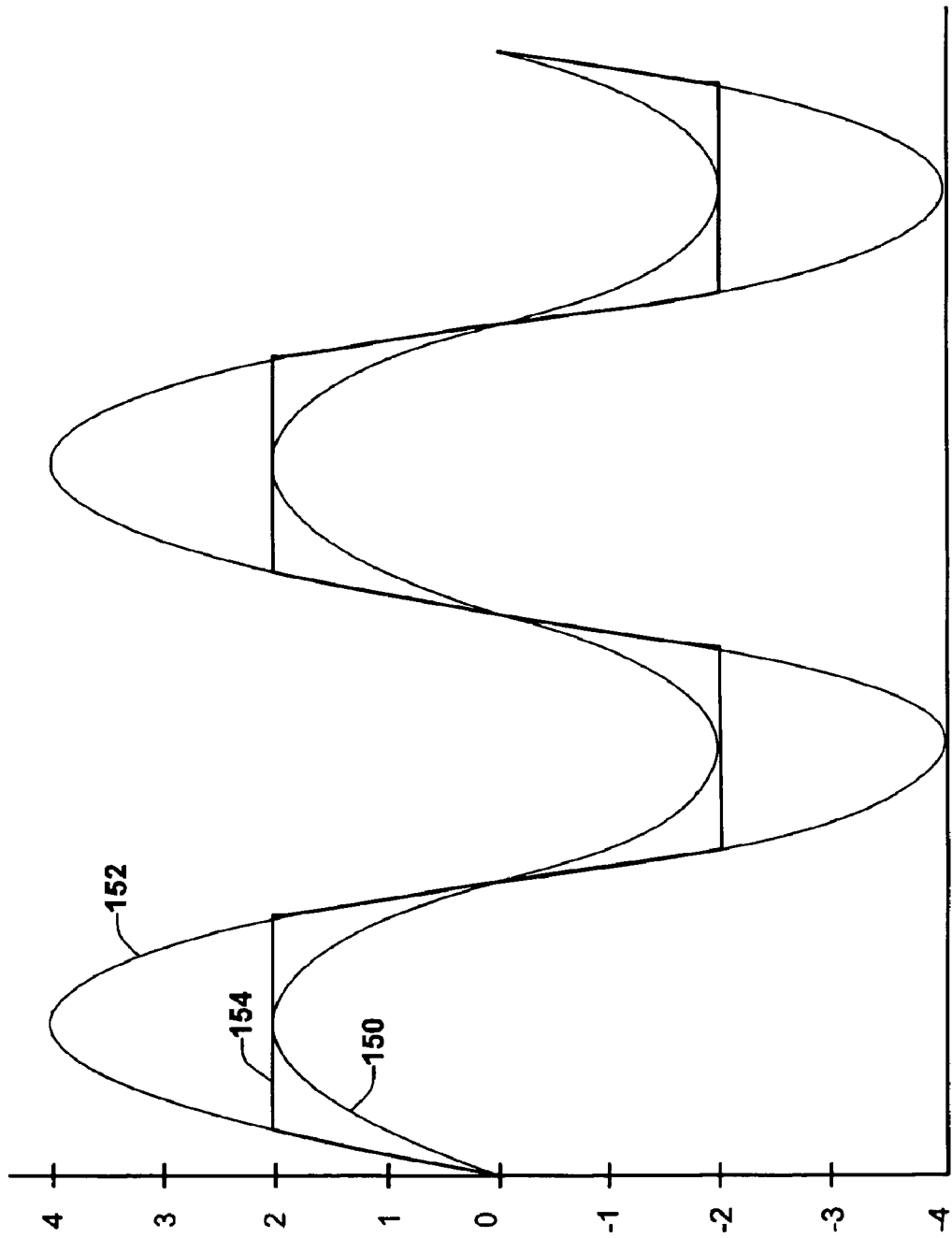
FIG. 4 depicts a graph illustrating output waveforms that can be generated by an amplifier in accordance with an aspect of the present invention.

FIG. 4 illustrates curves plotting voltage as a function of time for various signals in an amplifier that can be implemented in accordance with an aspect of the present invention. In the example of FIG. 4, an amplifier input signal is indicated at 150, such as can be provided to an input of an associated amplifier. For the example of a gain of two, the amplifier can provide an output signal, indicated at 152, in a situation where no clamping is implemented or in which the clamping levels have been set to exceed +4 V and −4 V, respectively. That is, the amplifier output signal 152 follows the input signal 150.

In a situation where high and low clamping voltages are set at +2 V and −2 V, a corresponding clamped output signal is depicted at 154. As depicted in FIG. 4, it will be appreciated that the clamping occurs substantially instantaneously when the output signal reaches the respective clamping voltages (e.g., +2 V and −2 V). In a situation where the amplifier output voltage (e.g., corresponding to the high impedance input of an amplifier output stage implemented according to an aspect of the present invention) drops below the high clamping voltage (e.g., +2 V), there is a very slight distortion, although generally superior to conventional approaches. Thus, those skilled in the art will further appreciate that a clamping amplifier implemented in accordance with an aspect of the present invention provides a sharp clamping point. Additionally, it will be appreciated that this approach provides low distortion near the clamping voltages so that the output can track the input signal within the amplifier output range established by the clamping voltages.

Figure 5:
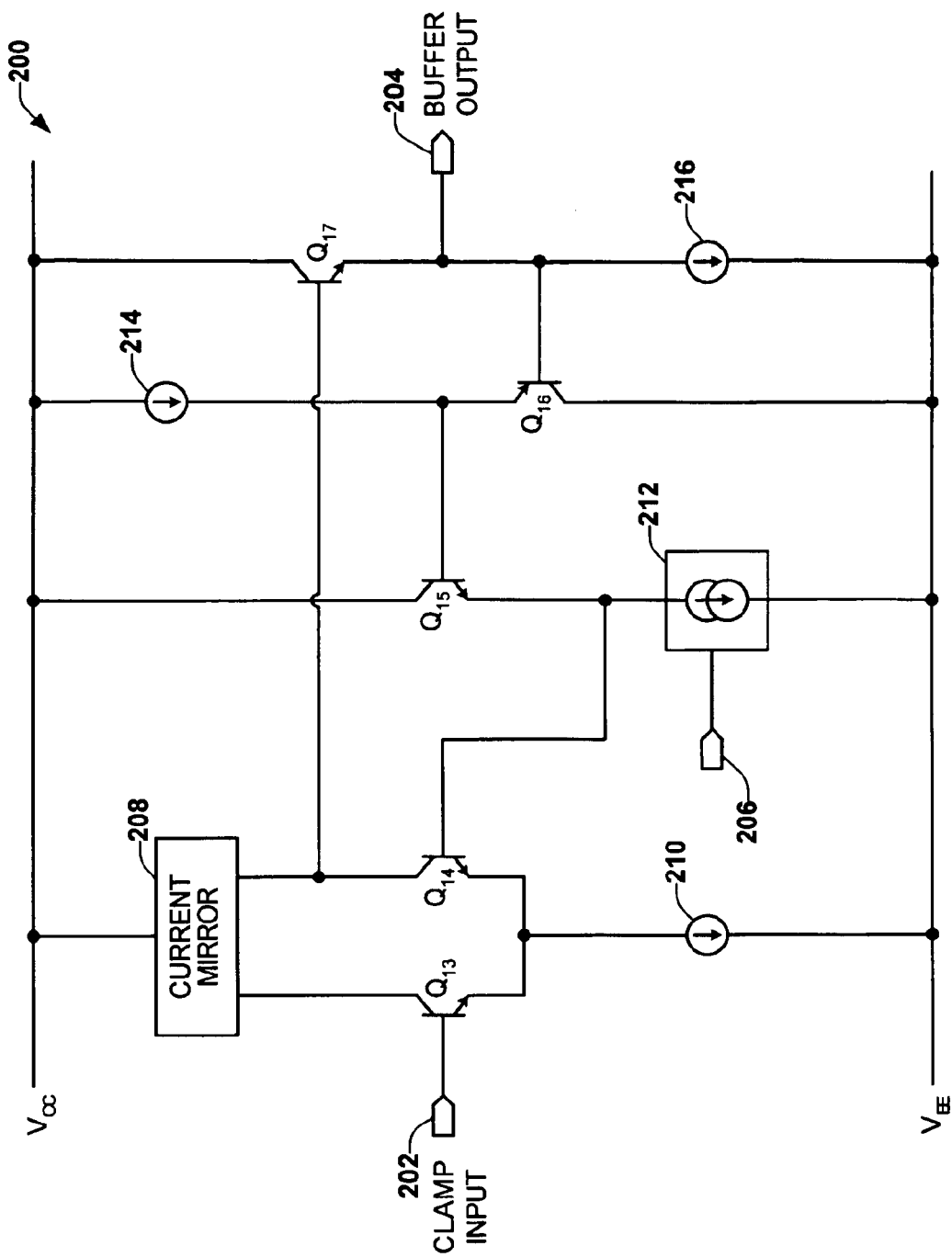
FIG. 5 depicts an example of a clamping buffer stage that can be utilized with an amplifier in accordance with an aspect of the present invention.

FIG. 5 illustrates an example of a clamp input buffer 200 that can be implemented as part of an amplifier in accordance with an aspect of the present invention. The buffer 200 includes an input 202, which corresponds to an external input of an associated amplifier for setting a clamp voltage. The buffer 200 provides an output signal ($V_{CLAMP}$) at an output 204. In this example, the buffer 200 operates dynamically to provide the output signal at 204 based on the clamping input signal provided at 202 and based on a control signal provided at an input 206. The input signal provided at 206 varies as a function of the load resistance coupled to the associated amplifier.

For the example amplifier circuit shown and described with respect to FIG. 3, the input at 202 can correspond to the external input 126, and the output 204 of the buffer stage 200 can correspond to the output of the clamp buffer 124 that is coupled to the bases of Q7 and Q8. The control input provided at 206, for example, further can correspond to the control input 136 from the current mirror 112 (FIG. 3), which can be coupled to the common collector of Q4 and Q12 (FIG. 3). A similar auxiliary buffer stage can be implemented for a complementary clamp buffer (e.g., for buffer stage 130 in FIG. 3) of an amplifier circuit, if desired.

The external clamp input signal at 202 is provided to the base of a transistor Q13. Q13 is coupled to a current mirror 208 between Q13 and $V_{cc}$. The emitter of Q13 is coupled to $V_{cc}$ through a current source 210 that is operative to bias the transistor accordingly. Another transistor Q14 is coupled having a common emitter with Q13 so as to form a differential pair of transistors Q13 and Q14. Q14 is coupled between the current source 210 and the current mirror 208. The base of Q14 is coupled to a variable current source (e.g., implemented as a transistor network) 212. The variable current source 212 is operative to bias Q14 based on the control input signal provided at 206. As mentioned above, the control input at 206 corresponds to an internal signal associated with an amplifier circuit implemented in accordance with an aspect of the present invention, which signal is indicative of the load coupled to the amplifier output.

The variable current source 212 in turn biases Q14 by providing a load dependent input at the base of Q14. That is, the control input at 206 is not necessarily a fixed bias, but instead is load dependent, namely, it varies according to the current being provided by the current mirror to which it is associated. Q15 is coupled between $V_{cc}$ and the base of Q14 to operate as a pull-up transistor at the base of Q14 depending in part on the current being drawn by the variable current source 212. The base of Q15 is coupled to the emitter of Q16, which is coupled between a current source 214 and $V_{cc}$. The base of Q 16 is coupled to the output 204 of the buffer stage, which output is coupled between transistor Q17 and a current source Q16. The base of Q17 is coupled to the collector of Q14 and the collector of Q17 is coupled to $V_{cc}$. The current source 216 is coupled between the emitter of Q17 and $V_{cc}$. Thus, Q16, Q15 and the variable current source 212 cooperate to adjust the bias at the base of Q14 so that the buffer output signal at 204 can vary based on the load, as indicated by the control signal at 206.

Additionally, it will be understood and appreciated that the follower network formed by Q15 and Q16 can be configured to balance offsets generated by associated components of clamp buffer networks of the associated amplifier. For example, where the buffer 200 corresponds to the clamp buffer system 124 of the amplifier circuit 100 of FIG. 3, the NPN Q15 and PNP Q16 can be substantially matched to balance offset associated with NPN Q9 and PNP Q7 of the low auxiliary buffer system 120. It further will be appreciated that by implementing a buffer stage 200 having a load dependent control input provided at 206, the clamp output signal provided at 204 can vary dynamically as a function of the load to mitigate load dependent offset that otherwise might occur during the clamping mode. As a result, an amplifier system implemented in accordance with an aspect of the present invention can provide a more accurate clamping voltage over wide range of output loads.

Figure 6:
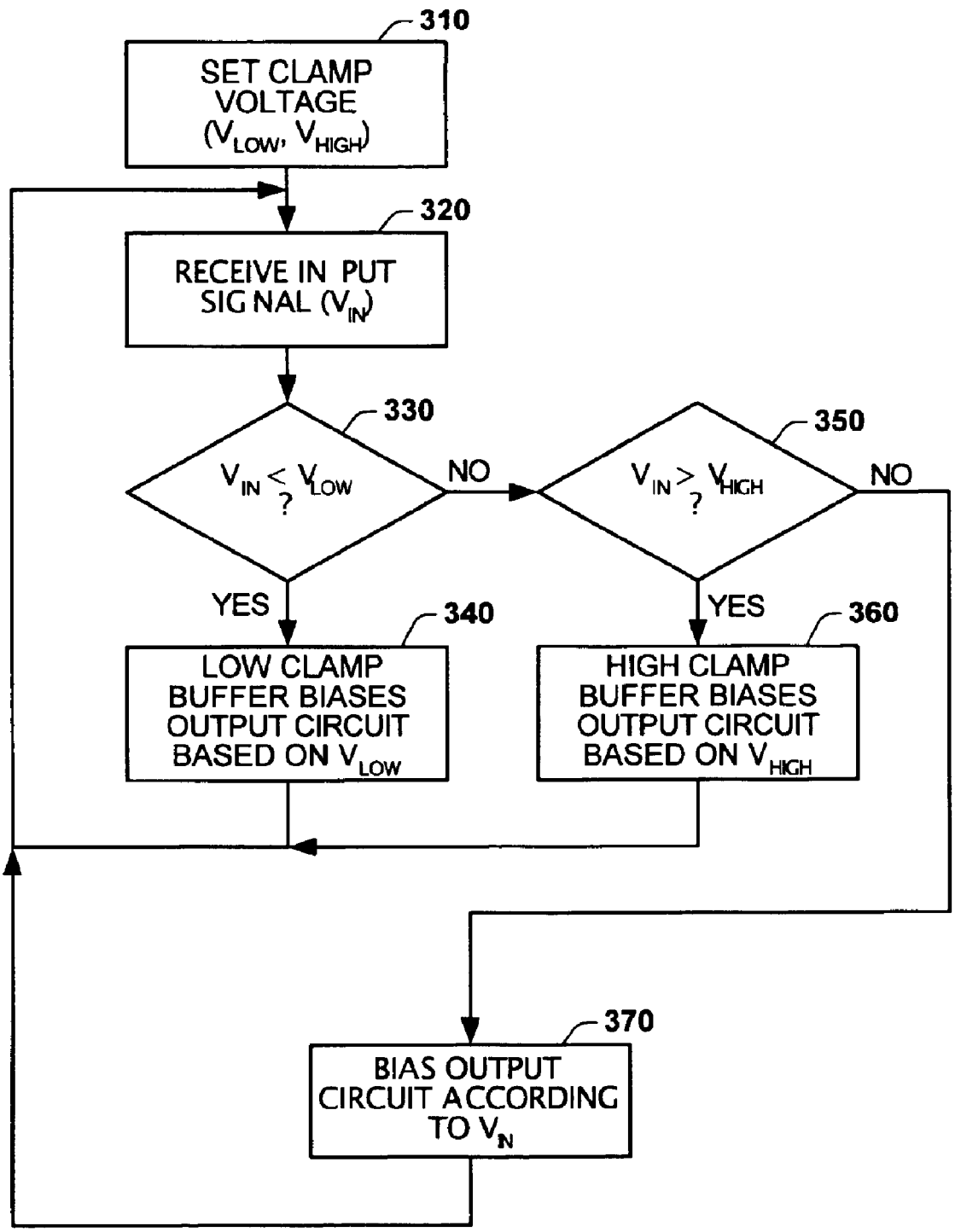
FIG. 6 depicts a flow diagram implementing a methodology for amplifying an input signal according to an aspect of the present invention.

In view of the foregoing structural and functional features described above, an amplification methodology, in accordance with an aspect of the present invention, will be better appreciated with reference to FIG. 6. While, for purposes of simplicity of explanation, the methodology of FIG. 6 is shown and described as being implemented serially, it is to be understood and appreciated that the present invention is not limited to the illustrated order, as some aspects could, in accordance with the present invention, occur in different orders and/or concurrently with other aspects from that shown and described. Moreover, not all illustrated features may be required to implement a methodology in accordance with an aspect of the present invention. It is to be further understood that the following methodologies can be implemented in hardware, such as one or more integrated circuits, software, or any combination thereof.

FIG. 6 illustrates a methodology that can be utilized to implement an amplifier according to an aspect of the present invention. The methodology begins at 310 in which one or more clamp voltages is set. In this example, there is a low clamp voltage, indicated at $V_{LOW}$ and a high voltage, indicated at $V_{HIGH}$, which voltages can be set by coupling associated pins of an IC implementing the amplification method to desired clamp voltages. The respective clamp voltages $V_{LOW}$ and $V_{HIGH}$ can be set to virtually any substantially fixed clamp voltage, such as according to the limits of the voltage rail provided by the amplifier. Additionally, the clamp voltages can be left open, in which case respective default clamp voltages can be implemented.

After the clamp voltages have been set at 310, the methodology proceeds to 320 at which an input signal ($V_{IN}$) is received. $V_{IN}$ can correspond to an internal or intermediate amplifier output signal provided by an input or intermediate stage of the amplifier such as at a high impedance or compensation node thereof. For the example where the clamping is implemented in the output stage of a multi-stage amplifier IC, the input signal $V_{IN}$ can correspond to an output of a preceding amplifier stage, such as at an internal high impedance node of the IC.

At 330, a determination is made as to whether $V_{IN}$ is less than $V_{LOW}$. If a determination is positive, indicating that a low voltage clamp condition exists, the methodology proceeds to 340. At 340, the low clamp buffer biases the output circuit at $V_{LOW}$. The biasing of output circuitry at 340, for example, includes disconnecting the high impedance node at which $V_{IN}$ is received (320) from the output (e.g., by deactivating an associated input buffer) and causing an auxiliary clamp buffer to bias the output circuit according to the low clamping voltage $V_{LOW}$. It is to be appreciated that by employing the output of the clamp buffer to bias the output circuit, small transistors (e.g., when compared to the output transistors in the output circuit) can be utilized. This enables the methodology to achieve a sharp clamp point with low distortion near the clamp voltage. Additionally, information indicative of the output load (e.g., current) can be provided from an associated bias network of the amplifier to the low clamp buffer to adjust the low clamping bias signal level as a function of the load. This enables the low clamping buffer to dynamically adjust the buffer output to provide a desired clamped output (e.g., $V_{LOW}$) over a wide range of output loads.

From 340, the methodology retruns to 320 in which the methodology can repeat. If the determination at 330 is negative, the methodology proceeds to 350. At 350, a determination is made as to whether $V_{IN}$ is greater than $V_{HIGH}$. If the determination at 350 is positive, indicating a high voltage clamp condition exists, the methodology proceeds to 360. At 360, the high clamp buffer biases the output circuit based on $V_{HIGH}$. This can include disconnecting or deactivating the input buffer that receives $V_{IN}$ relative to the output and, in turn, enabling a high clamp buffer to bias the output circuit according to $V_{HIGH}$. Additionally, information indicative of the output load (e.g., current) can be provided from a bias network of the amplifier to the high clamp buffer to adjust the high clamping bias signal level as a function of the load. From 360, the methodology returns to 320 in which the methodology can repeat.

In the event that the determination at 350 is negative the methodology proceeds to 370. This corresponds to a situation in which $V_{IN}$ is between both $V_{LOW}$ and $V_{HIGH}$, thus corresponding to a normal operating mode of the amplifier. At 370, the output circuit is biased according to $V_{IN}$, such that the output can follow $V_{IN}$ according to the gain implemented by the amplifier. In accordance with one aspect of the present invention, the amplifier is implemented as an output stage of an amplifier system in which the output stage has unity gain. It is to be understood and appreciated, however, that the output stage could be implemented to have other than a unity gain.

What has been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. An output stage for an amplifier, comprising:
   an input buffer that receives an input signal; and
   a clamp buffer that receives a clamp signal, the clamp buffer being coupled to the input buffer;
   one of the input buffer and the clamp buffer biasing an associated output portion of the output stage to provide an output signal depending on the input signal relative to the clamp signal.

2. The output stage of claim 1, the output portion provides the output signal based on the input signal when the output stage operates in a normal mode and provides the output signal based on the clamp signal when the output stage operates in a clamping mode, the mode depending on the level of the input signal relative to the clamp signal.

3. The output stage of claim 1, further comprising a differential pair of components that couples the input buffer with the clamp buffer, the differential pair controls which of the input buffer and the clamp buffer biases the output portion.

4. The output stage of claim 3, one of the differential pair of components being part of the input buffer and another of the differential pair of components being part of the clamp buffer, the differential pair of components controls which of the input buffer and the clamp buffer biases the output portion.

5. The output stage of claim 3, the differential pair operates to disable the input buffer during a clamping mode based on the input signal being within a clamping range established by the clamp signal, such that a feedback loop that includes the output portion and the input buffer is broken during the clamping mode.

6. The output stage of claim 3 further comprising a bias network coupled to receive a bias signal from the one of the input buffer and the clamp buffer that is biasing the output portion, the bias network is coupled to bias the output portion of the output stage based on the bias signal.

7. The output stage of claim 6, the bias network comprising a current mirror network.

8. The output stage of claim 6, the differential pair of components further comprising transistors, each having a common emitter that is coupled to bias the bias network based on a relative level of the input signal and the clamp signal.

9. The output stage of claim 6, the output portion further comprising an output circuit that provides the output signal based on the biasing implemented by the bias network.

10. The output stage of claim 9, the output circuit comprising at least one transistor biased by the bias network to provide at least a portion of the output signal.

11. The output stage of claim 1, the clamp buffer comprising first and second buffer systems coupled to the input buffer, each of the first and second buffer systems is coupled to receive respective first and second clamp signals for biasing the output portion during a respective clamping mode, the output stage operating in a respective one of the clamping modes depending on the input signal relative to each of the first and second clamp signals.

12. The output stage of claim 11, the input buffer comprising plural transistors in a diamond follower arrangement, each of the first and second buffer systems comprising plural transistors in a diamond follower arrangement, at least one of the transistors of the first buffer system and the input buffer are shared, and at least one of the transistors of the second buffer system and the input buffer are shared, whereby biasing the output portion during first and second clamping modes is facilitated.

13. The output stage of claim 1, the clamp buffer further comprising a dynamic buffer that provides a dynamic buffer output signal for biasing the output portion during a clamping mode as a function of a load connected at the output.

14. An amplifier system implementing the output stage of claim 1, the amplifier system comprising:
a preceding amplifier stage that amplifies a signal received thereby according to an associated gain and provides the input signal to the output stage.

15. An integrated circuit comprising the amplifier system of claim 14.

16. An amplifier system comprising:
an input buffer that provides a first bias signal based on an input signal received by the input buffer; and
at least one clamp buffer associated with the input buffer and provides a second bias signal based on a clamp signal;
a bias network coupled to the input buffer and to the at least one clamp buffer;
an output circuit coupled to the bias network, the bias network biases the output circuit to provide an output signal based on the first bias signal when the system operates in the a normal operating mode, and biasing the output circuit to provide the output signal based on the second bias signal when the system operates in a clamping mode, the operating mode is based on the input signal relative to the clamp signal.

17. The system of claim 16, the bias network further comprising at least one current mirror.

18. The system of claim 16, further comprising at least one preceding amplifier stage coupled to provide the input signal to the input buffer.

19. An integrated circuit comprising the amplifier system of claim 16.

20. The system of claim 16, the output circuit further comprising at least one output transistor, the at least one clamp buffer including at least one transistor that is substantially smaller than the at least one output transistor of the output circuit, whereby switching between the normal and clamping operating modes is facilitated.

21. The system of claim 16, further comprising a control network that includes at least one component from the input buffer and at least one component from the at least one clamp buffer, the control network enabling one of the input buffer and the at least one clamp buffer to provide the respective bias signal to the bias network based on the input signal relative to the clamp signal.

22. The system of claim 21, the control network further comprising a differential pair of transistors that couples the input buffer with the at least one clamp buffer, the differential pair controls which of the input buffer and the at least one clamp buffer biases the bias network based on the input signal relative to the clamp signal.

23. The system of claim 16, the clamp buffer comprising first and second buffer systems coupled with the input buffer, each of the first and second buffer systems is coupled to receive a respective one of first and second clamp signals to control the bias network to bias the output in a respective clamping mode depending on the input signal relative to each of the first and second clamp signals.

24. The system of claim 23, the input buffer comprising plural transistors in a diamond follower arrangement, each of the first and second buffer systems comprising plural transistors in a diamond follower arrangement, the first buffer system and the input buffer share at least one transistor, and the second buffer system and the input buffer share at least one transistor, whereby biasing during first and second clamping modes is facilitated.

25. The system of claim 16, the at least one clamp buffer further comprising a dynamic buffer portion that provides a dynamic buffer output signal as a function of a load connected at the output, the at least one clamp buffer dynamically biases the bias network during the clamping mode based on the dynamic buffer output signal.

26. An amplifier system comprising:
first means for, during a normal operating mode, buffering an amplifier input signal to bias an associated output portion of the amplifier system based on the amplifier input signal;
second means for, during a clamp operating mode, buffering at least one clamp input signal to bias the associated output portion based on the clamp input signal; and
means for controlling which of the normal and clamp operating modes is implemented based on the amplifier input signal relative to the at least one clamp input signal, the means for controlling being coupled to the first means for buffering and to the second means for buffering to enable biasing of the associated output portion according to the operating mode.

27. The amplifier system of claim 26, further comprising means for biasing the output portion of the amplifier system based on the mode being implemented by the means for controlling.

28. The amplifier system of claim 26, further comprising means for varying the biasing provided by the second means for buffering during the clamping mode based on a load connected to the output portion.

29. A method for amplifying an input signal comprising:
receiving at least one clamp signal at an output stage of an amplifier to set an associated clamping level;
while in normal operating mode, biasing an output portion of the amplifier to provide an amplifier output signal based on the input signal;
while in a clamping mode, biasing the output portion to provide the output signal based on the clamp level; and
controlling the operating mode based on the input signal relative to the clamp level.

30. The method of claim 29, further comprising varying the biasing of the output portion in the clamping mode based on a load connected to the output portion.

* * * * *